US009875001B2

(12) United States Patent
Kanungo et al.

(10) Patent No.: US 9,875,001 B2
(45) Date of Patent: Jan. 23, 2018

(54) NETWORK DEVICE MANAGEMENT AND VISUALIZATION

(71) Applicants: Biswajit Kanungo, San Jose, CA (US); Pramod Bangalore, San Jose, CA (US)

(72) Inventors: Biswajit Kanungo, San Jose, CA (US); Pramod Bangalore, San Jose, CA (US)

(73) Assignee: Avaya Inc., Santa Clara, CA (US)

( * ) Notice: Subject to any disclaimer, the term of this patent is extended or adjusted under 35 U.S.C. 154(b) by 659 days.

(21) Appl. No.: 14/010,317

(22) Filed: Aug. 26, 2013

(65) Prior Publication Data

US 2014/0059442 A1 Feb. 27, 2014

Related U.S. Application Data

(60) Provisional application No. 61/693,323, filed on Aug. 26, 2012.

(51) Int. Cl.
*G06F 15/173* (2006.01)
*G06F 3/0484* (2013.01)
*G06F 1/20* (2006.01)
*H05K 7/14* (2006.01)
*H04L 12/26* (2006.01)
*H04L 12/24* (2006.01)

(52) U.S. Cl.
CPC ............ *G06F 3/0484* (2013.01); *G06F 1/206* (2013.01); *H04L 41/0213* (2013.01); *H04L 41/22* (2013.01); *H04L 43/08* (2013.01); *H04L 43/0817* (2013.01); *H05K 7/1498* (2013.01)

(58) Field of Classification Search
CPC .... G06F 15/173; G06F 15/177; G06F 3/0484; G06F 15/161; H06F 15/16; H05K 5/00; H05K 7/14; H05K 7/18; H05K 7/1412; H05K 7/1425; H05K 7/1485; H05K 7/1488; H05K 7/1489
USPC ......................................... 709/223, 217, 200
See application file for complete search history.

(56) References Cited

U.S. PATENT DOCUMENTS

| | | | | |
|---|---|---|---|---|
| 5,949,974 A | * | 9/1999 | Ewing | G06F 1/26 709/202 |
| 6,018,625 A | * | 1/2000 | Hayball et al. | 703/22 |
| 6,233,610 B1 | * | 5/2001 | Hayball et al. | 709/223 |
| 6,711,613 B1 | * | 3/2004 | Ewing | G06F 1/26 709/223 |
| 7,457,858 B1 | * | 11/2008 | Levesque | H04L 12/66 709/206 |
| 8,024,451 B2 | * | 9/2011 | Fowler et al. | 709/224 |
| 8,407,328 B2 | * | 3/2013 | Kellagher et al. | 709/223 |
| 8,427,007 B2 | * | 4/2013 | Jansma et al. | 307/19 |
| 2004/0006619 A1 | * | 1/2004 | Syed | H04L 41/0213 709/224 |
| 2004/0083017 A1 | * | 4/2004 | Brown | G06Q 10/043 700/97 |
| 2004/0160897 A1 | * | 8/2004 | Fowler et al. | 370/241 |
| 2004/0205181 A1 | * | 10/2004 | Ewing | G06F 1/26 709/223 |
| 2006/0026672 A1 | * | 2/2006 | Braun | G05B 19/042 726/9 |
| 2006/0047466 A1 | * | 3/2006 | White | H05K 7/20836 702/130 |

(Continued)

*Primary Examiner* — El Hadji Sall
(74) *Attorney, Agent, or Firm* — IP Spring

(57) ABSTRACT

Methods, systems and computer readable media for network device management and visualization are disclosed.

17 Claims, 5 Drawing Sheets

(56) References Cited

U.S. PATENT DOCUMENTS

| | | | |
|---|---|---|---|
| 2006/0047800 A1* | 3/2006 | Caveney | H04L 12/24 709/223 |
| 2006/0176900 A1* | 8/2006 | Liu | H04Q 3/64 370/465 |
| 2008/0195786 A1* | 8/2008 | Lee | G06F 3/0607 710/302 |
| 2011/0084839 A1* | 4/2011 | Groth | G06Q 10/087 340/572.1 |
| 2011/0205693 A1* | 8/2011 | Jansma et al. | 361/601 |
| 2013/0031399 A1* | 1/2013 | Watson | 713/340 |
| 2013/0086336 A1* | 4/2013 | Canepa | G06F 3/0683 711/154 |
| 2014/0292167 A1* | 10/2014 | Sojka | H05K 7/1498 312/234 |

\* cited by examiner

NETWORK DEVICE MANAGEMENT AND VISUALIZATION

RELATED APPLICATIONS

This application claims the benefit of U.S. Provisional Application No. 61/693,323, entitled "Network Device Manager, Virtual Machine Discovery And Identification, and Virtual Machine Software Licensing" and filed on Aug. 26, 2012, which is incorporated herein by reference in its entirety.

TECHNICAL FIELD

Embodiments relate generally to computer networks, and more particularly, to methods, systems and computer readable media for network device management and visualization.

BACKGROUND

There may be a need to remotely visualize network equipment configurations (e.g., rack configurations), indicators (e.g., LEDs) and temperatures in order to facilitate management of the network equipment.

Embodiments were conceived in light of the above mentioned needs, problems and/or limitations, among other things.

SUMMARY

One or more embodiments can include a method for enterprise network device management. The method can include providing for display, using one or more processors, a device management user interface, the device management user interface being configured to permit adding, deleting or modifying an equipment profile for an equipment rack. The method can also include receiving, at the one or more processors, add, edit or delete information corresponding to the equipment rack. The method can also include updating, at the one or more processors, the equipment profile. The method can further include storing, using the one or more processors, the updated equipment profile. The method can also include updating, using the one or more processors, the device management user interface based on the updated equipment profile.

The method can also include providing a servicability agent in the equipment rack, the servicability agent configured to communicate information about the equipment rack to a device management system. The method can further include capturing a status of one or more indicator lights on the equipment rack and determining network status of one or more ports. The method can also include receiving, at the one or more processors, the status of the one or more indicator lights and the network status of the one or more ports, and displaying a representation of the indicator lights and the network status of the one or more ports.

The indicator light status can be captured via periodic polling and the network interface status is determined via simple network management protocol (SNMP). The method can also include obtaining one or more temperatures inside one or more respective components of the equipment rack, and receiving, at the one or more processors, the one or more temperatures. The method can further include determining whether each temperature is within one or more predetermined ranges, and displaying a visual representation of each temperature and an indication of a predetermined range associated with each temperature.

The method can also include providing a user interface element corresponding to each port, the user interface element configured to permit a user to change a port type of the corresponding port. The method can further include providing a user interface configured to permit a user to change a description, a location and an interface type for one or more interfaces associated with the equipment rack.

Some implementations can include a system comprising one or more processors configured to perform operations. The operations can include providing for display, using the one or more processors, a device management user interface, the device management user interface being configured to permit adding, deleting or modifying an equipment profile for an equipment rack. The operations can also include receiving, at the one or more processors, add, edit or delete information corresponding to the equipment rack and updating, at the one or more processors, the equipment profile. The operations can further include storing, using the one or more processors, the updated equipment profile, and updating, using the one or more processors, the device management user interface based on the updated equipment profile.

The operations can also include providing a servicability agent in the equipment rack, the servicability agent configured to communicate information about the equipment rack to a device management system. The operations can further include capturing a status of one or more indicator lights on the equipment rack, and determining network status of one or more ports.

The operations can also include receiving, at the one or more processors, the status of the one or more indicator lights and the network status of the one or more ports, and displaying a representation of the indicator lights and the network status of the one or more ports. The indicator light status can be captured via periodic polling and the network interface status is determined via simple network management protocol (SNMP). The operations can further include obtaining one or more temperatures inside one or more respective components of the equipment rack, and receiving, at the one or more processors, the one or more temperatures.

The operations can also include determining whether each temperature is within one or more predetermined ranges, and displaying a visual representation of each temperature and an indication of a predetermined range associated with each temperature. The operations can further include providing a user interface element corresponding to each port, the user interface element configured to permit a user to change a port type of the corresponding port. The operations can also include providing a user interface configured to permit a user to change a description, a location and an interface type for one or more interfaces associated with the equipment rack.

Some implementations can include a nontransitory computer readable medium having software instructions stored thereon that, when executed by one or more processors, cause the one or more processors to perform operations. The operations can include providing for display, using the one or more processors, a device management user interface, the device management user interface being configured to permit adding, deleting or modifying an equipment profile for an equipment rack. The operations can further include receiving, at the one or more processors, add, edit or delete information corresponding to the equipment rack, and updating, at the one or more processors, the equipment profile.

The operations can also include storing, using the one or more processors, the updated equipment profile, and updating, using the one or more processors, the device management user interface based on the updated equipment profile. The operations can further include providing a servicability agent in the equipment rack, the servicability agent configured to communicate information about the equipment rack to a device management system.

The operations can also include capturing a status of one or more indicator lights on the equipment rack, and determining network status of one or more ports. The operations can further include receiving, at the one or more processors, the status of the one or more indicator lights and the network status of the one or more ports, and displaying a representation of the indicator lights and the network status of the one or more ports. The indicator light status can be captured via periodic polling and the network interface status is determined via simple network management protocol (SNMP).

The operations can also include obtaining one or more temperatures inside one or more respective components of the equipment rack, and receiving, at the one or more processors, the one or more temperatures. The operations can further include determining whether each temperature is within one or more predetermined ranges, and displaying a visual representation of each temperature and an indication of a predetermined range associated with each temperature.

The operations can also include providing a user interface element corresponding to each port, the user interface element configured to permit a user to change a port type of the corresponding port. The operations can further include providing a user interface configured to permit a user to change a description, a location and an interface type for one or more interfaces associated with the equipment rack.

DETAILED DESCRIPTION

Figure 1:
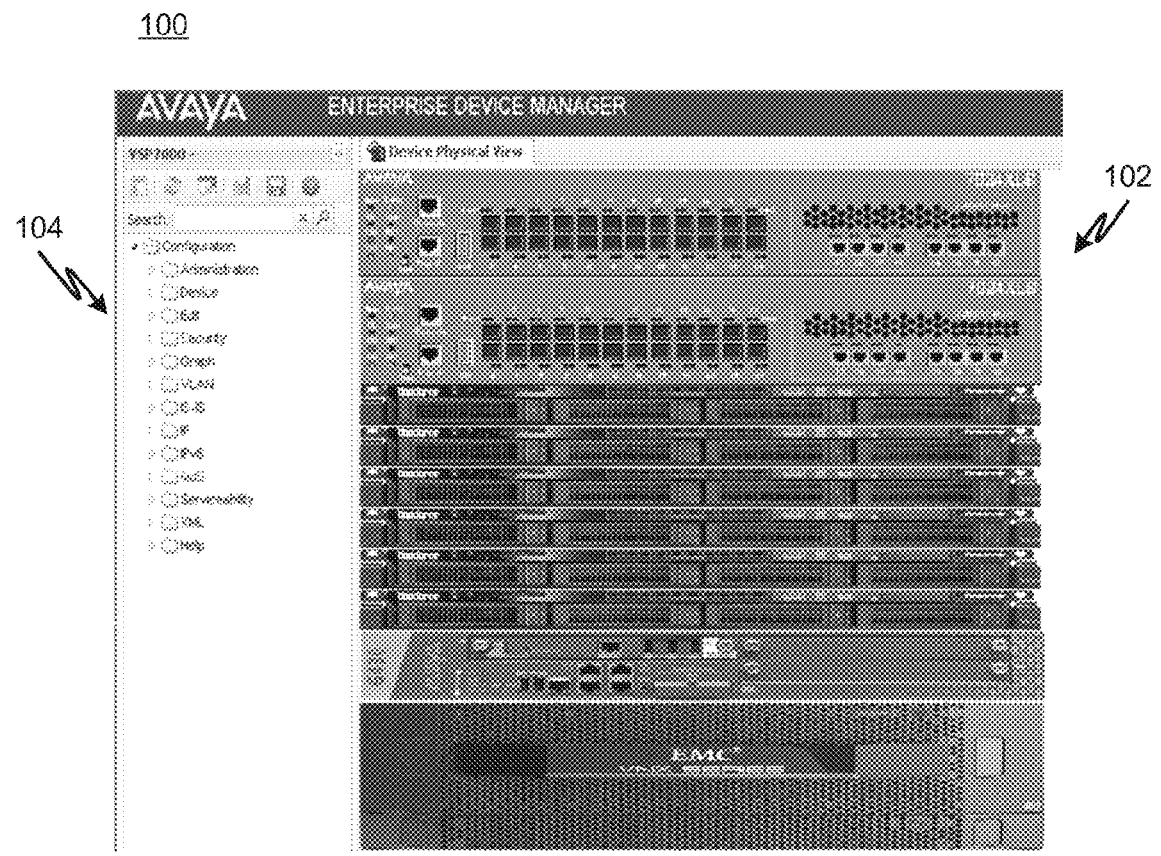
FIG. 1 is a diagram of an example network device manager user interface in accordance with at least one embodiment.

FIG. 1 is a diagram of an example network device manager user interface 100 in accordance with at least one embodiment. The user interface 100 includes a graphical display section 102 that provides a graphical representation of network equipment including, but not limited to, a rack configuration. The user interface 100 also includes a navigation tree element 104 for configuring the rack components. The user interface can include a view of the front of the equipment rack and a view of the rear of the equipment rack and can be selectable between these two viewing modes.

An embodiment of the user interface can include a virtualized application hosted on a management server in a rack environment. An embodiment can also include a browser based application.

The network device manager can include integration with UCM-CS (SSO and Credential service) and visualization of a rack and its components (e.g., VSP7k switches, VM Hosts, Gateway and EMC storage). As mentioned above, the network device manager can also include a navigation tree for configuring the rack components.

The network device manager can detect state changes of components (e.g., unreachable) and sub components (LED states). The network device manager can be launched either as a standalone application or from management software such as a visualization, performance and fault monitoring (VPFM) system.

An embodiment can include a rack profile editor adapted to view/edit physical configuration changes made by a network administrator. The user interface can include launch points for component specific element managers, which may be external to the network device manager. An embodiment can also include an element to launch a VPFM monitoring dashboard.

Figure 2:
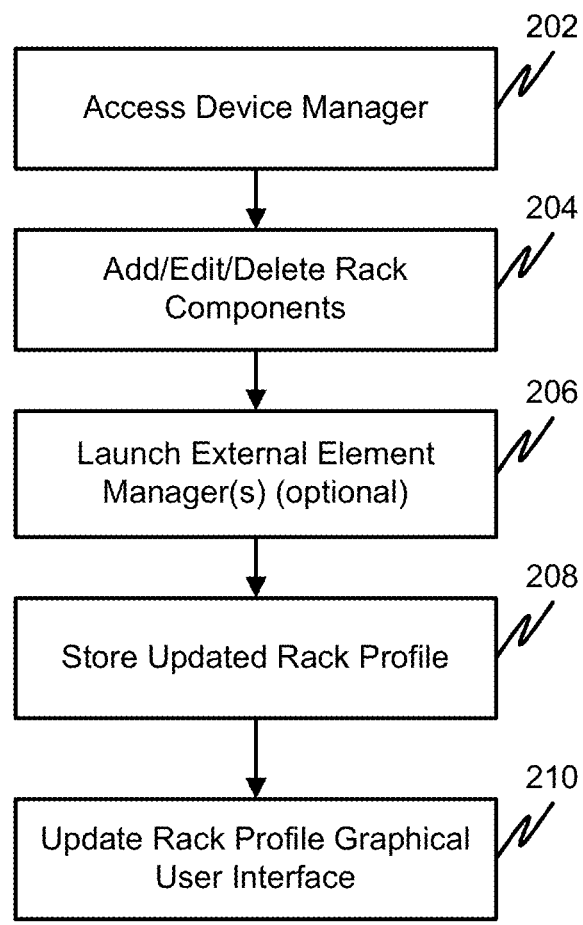
FIG. 2 is a flowchart of an example method for network device management in accordance with at least one embodiment.

FIG. 2 is a flowchart of an example method for network device management in accordance with at least one embodiment. Processing begins at 202, where the device manager is accessed. The device manager can be accessed in a number of ways. The access methods can include an on-box/embedded method in which a browser is pointed at the IP address of the device. The access methods can also include an off-box/plug-in method in which the application is launched through COM. The application can automatically discover components and render a physical view of the network equipment (e.g., a physical view of the rack configuration). The device manager application can operate in conjunction with a servicability agent running on a processor within the equipment rack. The servicability agent can be a standalone software program or can be incorporated into the device manager application. The servicability agent can be configured to monitor and communicate with one or more components within the equipment rack. Processing continues to 204.

At 204, a user interface is caused to be displayed. The user interface can display a graphical representation of the network equipment (e.g., similar to that shown in FIG. 1) and can also provide an interface for adding, editing and deleting individual pieces of equipment from a network equipment profile (e.g., a rack profile). The user interface can also display a physical status of the network equipment (e.g., LED, port, power supply, and/or the like). The application can also detect when a piece of equipment is not communicating or has been hot swapped. Processing continues to 206.

At 206, external device (or element) managers can optionally be launched from the user interface. These external managers can include management programs for managing specific devices. Processing continues to 208.

At 208, the updated equipment profile is stored. For example, is a user updates the equipment profile (e.g., rack profile) via the user interface, the updated equipment profile can be stored. Processing continues to 210.

At 210, the graphical user interface is updated to reflect any changes to the equipment profile. For example, the graphical display of the network equipment can be updated to reflect changes made to the network equipment profile. It will be appreciated that 202-210 can be repeated in whole or in part in order to accomplish a contemplated network equipment management task.

Figure 3:
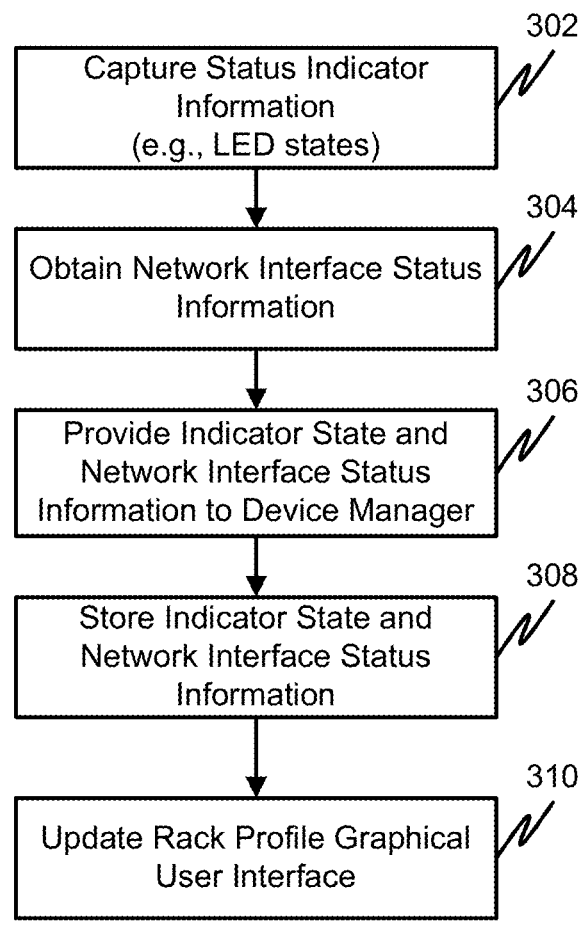
FIG. 3 is a flowchart of an example method for remote indicator viewing in accordance with at least one embodiment.

FIG. 3 is a flowchart of an example method for remote indicator viewing in accordance with at least one embodiment. Processing begins at 302, where status indicator information is obtained. The status indicators can include lights or light-emitting diodes (LEDs) on components in the equipment rack. Processing continues to 304.

At 304, network interface status information is obtained. The network interface status information can include network port connectivity status, data transfer status and/or data rate status. The network interface status can be shown by one or more indicator lights near the port. Processing continues to 306.

At 306, the servicability agent can transmit the indictor state and/or network interface status information to the device manager application. Processing continues to 308.

At 308, the received indicator state and network interface status information can be stored by the device manager. Processing continues to 310.

At 310, the rack profile graphical user interface is updated to reflect the received indicator status and network interface status information. It will be appreciated that 302-310 can be repeated in whole or in part in order to accomplish a contemplated equipment monitoring task.

Figure 4:
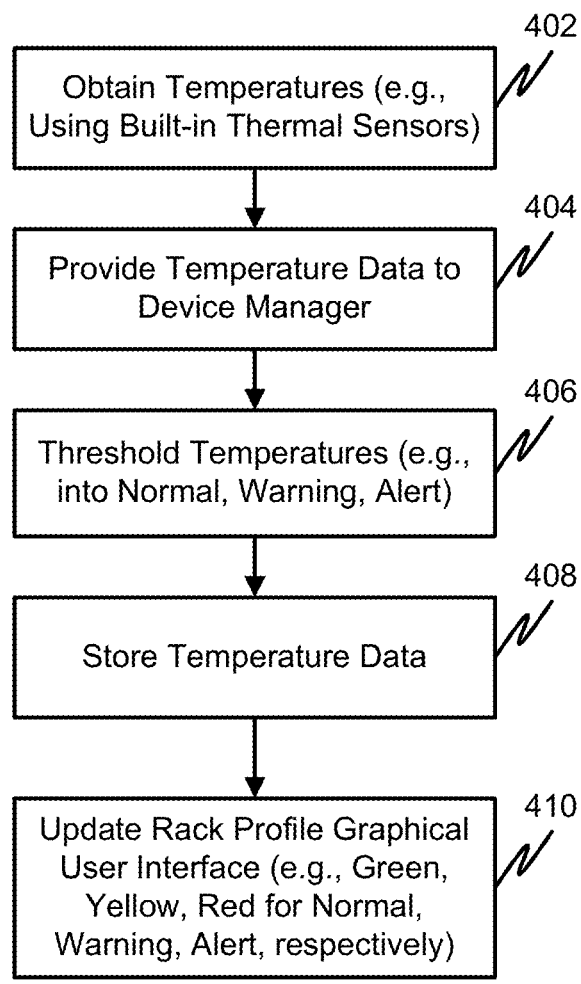
FIG. 4 is a flowchart of an example method for remote temperature monitoring in accordance with at least one embodiment.

FIG. 4 is a flowchart of an example method for remote temperature monitoring in accordance with at least one embodiment. Processing begins at 402, where temperature information from components in the equipment rack is obtained. For example, the temperatures can be obtained from thermal sensors built-in to the components (e.g., thermal sensors in the cases, processor thermal sensors or the like). Processing continues to 404.

At 404, the temperature data is provided to the device manager (e.g., by a servicability agent). Processing continues to 406.

At 406, the device manager can threshold the temperatures to determine if they fall within one or more predetermined ranges. Processing continues to 408.

At 408, the temperature data is stored. Processing continues to 410.

At 410, the rack profile graphical user interface is updated to reflect the temperature (and temperature range) information. For example, color codes can be used to show the temperature of devices in the rack, where green is used to indicate a temperature within a normal operating range, yellow is used to indicate a temperature approaching an undesirable level and red is used to indicate a temperature at an undesirable level (e.g., exceeding safe operation temperature). It will be appreciated that 402-410 can be repeated in whole or in part in order to accomplish a contemplated equipment monitoring task.

Figure 5:
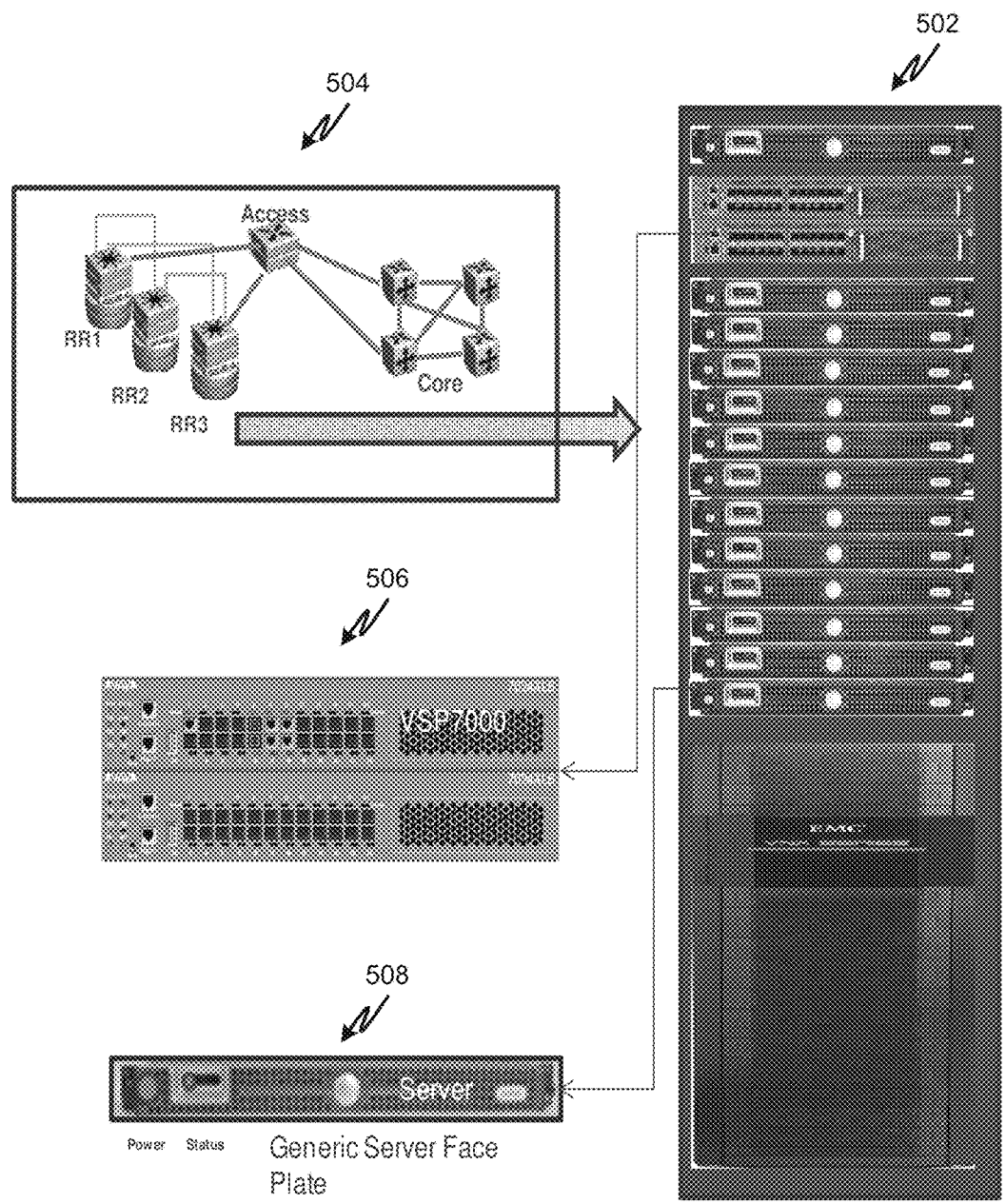
FIG. 5 is an example network equipment physical view in accordance with at least one embodiment.

FIG. 5 shows an example network equipment physical view (or visualization). The visualization 502 represents the physical network equipment in a rack corresponding to a network 504. The visualization 502 can include switches 506 and servers 508.

The visual elements can be exact or specific representations of actual hardware or can be generic representations that correspond to component types (e.g., temperature, status and power indicators, management servers, switches, servers and/or power supplies).

A VPFM system can include a menu having an option to open the network equipment device manager. The network equipment device manager can be an off-box (proxy) implementation on VM, for example. In the physical view, servers, storage and network can be shown on face plates. Server face plates shown in the physical view can be generic (e.g., not exact, as different server vendors often have different face plates).

Some implementations can include a user interface configured to permit a user to view and/or change port type (e.g., port "flavor") from the user interface. For example, a port could be changed from Avaya Aura to VDI or Avaya AURA/VDI.

Also, some implementations can include a user interface configured to permit a user to assign a description, location and/or type to an interface and change the interface from one type to another.

It will be appreciated that the modules, processes, systems, and sections described above can be implemented in hardware, hardware programmed by software, software instructions stored on a nontransitory computer readable medium or a combination of the above. A system as described above, for example, can include a processor configured to execute a sequence of programmed instructions stored on a nontransitory computer readable medium. For example, the processor can include, but not be limited to, a personal computer or workstation or other such computing system that includes a processor, microprocessor, microcontroller device, or is comprised of control logic including integrated circuits such as, for example, an Application Specific Integrated Circuit (ASIC). The instructions can be compiled from source code instructions provided in accordance with a programming language such as Java, C, C++, C#.net, assembly or the like. The instructions can also comprise code and data objects provided in accordance with, for example, the Visual Basic™ language, or another structured or object-oriented programming language. The sequence of programmed instructions, or programmable logic device configuration software, and data associated therewith can be stored in a nontransitory computer-readable medium such as a computer memory or storage device which may be any suitable memory apparatus, such as, but not limited to ROM, PROM, EEPROM, RAM, flash memory, disk drive and the like.

Furthermore, the modules, processes systems, and sections can be implemented as a single processor or as a distributed processor. Further, it should be appreciated that the steps mentioned above may be performed on a single or distributed processor (single and/or multi-core, or cloud computing system). Also, the processes, system components, modules, and sub-modules described in the various figures of and for embodiments above may be distributed across multiple computers or systems or may be co-located in a single processor or system. Example structural embodiment alternatives suitable for implementing the modules, sections, systems, means, or processes described herein are provided below.

The modules, processors or systems described above can be implemented as a programmed general purpose computer, an electronic device programmed with microcode, a hard-wired analog logic circuit, software stored on a computer-readable medium or signal, an optical computing device, a networked system of electronic and/or optical devices, a special purpose computing device, an integrated circuit device, a semiconductor chip, and/or a software module or object stored on a computer-readable medium or signal, for example.

Embodiments of the method and system (or their subcomponents or modules), may be implemented on a general-purpose computer, a special-purpose computer, a programmed microprocessor or microcontroller and peripheral integrated circuit element, an ASIC or other integrated circuit, a digital signal processor, a hardwired electronic or logic circuit such as a discrete element circuit, a programmed logic circuit such as a PLD, PLA, FPGA, PAL, or the like. In general, any processor capable of implementing the functions or steps described herein can be used to implement embodiments of the method, system, or a computer program product (software program stored on a nontransitory computer readable medium).

Furthermore, embodiments of the disclosed method, system, and computer program product (or software instructions stored on a nontransitory computer readable medium) may be readily implemented, fully or partially, in software using, for example, object or object-oriented software development environments that provide portable source code that can be used on a variety of computer platforms. Alternatively, embodiments of the disclosed method, system, and computer program product can be implemented partially or fully in hardware using, for example, standard logic circuits or a VLSI design. Other hardware or software can be used to implement embodiments depending on the speed and/or efficiency requirements of the systems, the particular function, and/or particular software or hardware system, microprocessor, or microcomputer being utilized. Embodiments of the method, system, and computer program product can be implemented in hardware and/or software using any known or later developed systems or structures, devices and/or software by those of ordinary skill in the applicable art from the function description provided herein and with a general basic knowledge of the software engineering and computer networking arts.

Moreover, embodiments of the disclosed method, system, and computer readable media (or computer program product) can be implemented in software executed on a programmed general purpose computer, a special purpose computer, a microprocessor, or the like.

It is, therefore, apparent that there is provided, in accordance with the various embodiments disclosed herein, methods, systems and computer readable media for network device management and visualization.

While the disclosed subject matter has been described in conjunction with a number of embodiments, it is evident that many alternatives, modifications and variations would be, or are, apparent to those of ordinary skill in the applicable arts. Accordingly, Applicants intend to embrace all such alternatives, modifications, equivalents and variations that are within the spirit and scope of the disclosed subject matter.

What is claimed is:

1. A method for enterprise network device management, the method comprising:
providing a servicability agent executing on a processor in an equipment rack, the servicability agent configured to communicate information about the equipment rack to a device management system having a device manager application, wherein the servicability agent is configured to transmit indictor state and network interface status information to the device manager application;
providing for display, using one or more processors, a device management user interface, the device management user interface displaying information about the equipment rack from the device management system and being configured to permit adding, deleting or modifying an equipment profile for the equipment rack;
receiving, at the one or more processors, add, edit or delete information corresponding to the equipment rack;
updating, at the one or more processors, the equipment profile to generate an updated equipment profile;
storing, using the one or more processors, the updated equipment profile; and
updating, using the one or more processors, the device management user interface based on the updated equipment profile.

2. The method of claim 1, further comprising:
capturing a status of one or more indicator lights on the equipment rack;
determining a network interface status of one or more ports;
receiving, at the one or more processors, the status of the one or more indicator lights and the network interface status of the one or more ports; and
displaying a representation of the indicator lights and the network interface status of the one or more ports.

3. The method of claim 2, wherein the indicator light status is captured via periodic polling and the network interface status is determined via simple network management protocol (SNMP).

4. The method of claim 1, further comprising:
obtaining one or more temperatures inside one or more respective components of the equipment rack;
receiving, at the one or more processors, the one or more temperatures;
determining whether each temperature is within one or more predetermined ranges; and
displaying a visual representation of each temperature and an indication of a predetermined range associated with each temperature.

5. The method of claim 1, further comprising:
providing a user interface element corresponding to each port, the user interface element configured to permit a user to change a port type of the corresponding port.

6. The method of claim 1, further comprising:
providing a user interface configured to permit a user to change a description, a location and an interface type for one or more interfaces associated with the equipment rack.

7. A system comprising:
one or more processors coupled to a nontransitory computer readable medium having stored thereon instructions, that when executed by the one or more processors, cause the one or more processors to perform operations including:
providing, at a device management system, a connection to a servicability agent executing on a processor in an equipment rack, the servicability agent configured to communicate information about the equipment rack to the device management system having a device manager application, wherein the servicability agent is configured to transmit indictor state and network interface status information to the device manager application;
providing for display, using the one or more processors, a device management user interface, the device management user interface displaying information about the equipment rack from the device management system and being configured to permit adding, deleting or modifying an equipment profile for the equipment rack;
receiving, at the one or more processors, add, edit or delete information corresponding to the equipment rack;
updating, at the one or more processors, the equipment profile to generate an updated equipment profile;

storing, using the one or more processors, the updated equipment profile; and updating, using the one or more processors, the device management user interface based on the updated equipment profile.

8. The system of claim 7, wherein the operations further include:
capturing a status of one or more indicator lights on the equipment rack;
determining a network interface status of one or more ports;
receiving, at the one or more processors, the status of the one or more indicator lights and the network interface status of the one or more ports; and
displaying a representation of the indicator lights and the network interface status of the one or more ports.

9. The system of claim 8, wherein the indicator light status is captured via periodic polling and the network interface status is determined via simple network management protocol (SNMP).

10. The system of claim 7, wherein the operations further include:
obtaining one or more temperatures inside one or more respective components of the equipment rack;
receiving, at the one or more processors, the one or more temperatures;
determining whether each temperature is within one or more predetermined ranges; and
displaying a visual representation of each temperature and an indication of a predetermined range associated with each temperature.

11. The system of claim 7, wherein the operations further include:
providing a user interface element corresponding to each port, the user interface element configured to permit a user to change a port type of the corresponding port.

12. The system of claim 7, wherein the operations further include:
providing a user interface configured to permit a user to change a description, a location and an interface type for one or more interfaces associated with the equipment rack.

13. A nontransitory computer readable medium having software instructions stored thereon that, when executed by one or more processors, cause the one or more processors to perform operations including:
providing, at a device management system, a connection to a servicability agent executing on a processor in an equipment rack, the servicability agent configured to communicate information about the equipment rack to the device management system having a device manager application, wherein the servicability agent is configured to transmit indictor state and network interface status information to the device manager application;

providing for display, using the one or more processors, a device management user interface, the device management user interface displaying information about the equipment rack from the device management system and being configured to permit adding, deleting or modifying an equipment profile for the equipment rack;
receiving, at the one or more processors, add, edit or delete information corresponding to the equipment rack;
updating, at the one or more processors, the equipment profile to generate an updated equipment profile;
storing, using the one or more processors, the updated equipment profile; and
updating, using the one or more processors, the device management user interface based on the updated equipment profile.

14. The nontransitory computer readable medium of claim 13, wherein the operations further include:
capturing a status of one or more indicator lights on the equipment rack;
determining a network interface status of one or more ports;
receiving, at the one or more processors, the status of the one or more indicator lights and the network interface status of the one or more ports; and
displaying a representation of the indicator lights and the network interface status of the one or more ports,
wherein the indicator light status is captured via periodic polling and the network interface status is determined via simple network management protocol (SNMP).

15. The nontransitory computer readable medium of claim 13, wherein the operations further include:
obtaining one or more temperatures inside one or more respective components of the equipment rack;
receiving, at the one or more processors, the one or more temperatures;
determining whether each temperature is within one or more predetermined ranges; and
displaying a visual representation of each temperature and an indication of a predetermined range associated with each temperature.

16. The nontransitory computer readable medium of claim 13, wherein the operations further include:
providing a user interface element corresponding to each port, the user interface element configured to permit a user to change a port type of the corresponding port.

17. The nontransitory computer readable medium of claim 13, wherein the operations further include:
providing a user interface configured to permit a user to change a description, a location and an interface type for one or more interfaces associated with the equipment rack.

* * * * *

UNITED STATES PATENT AND TRADEMARK OFFICE
CERTIFICATE OF CORRECTION

PATENT NO. : 9,875,001 B2
APPLICATION NO. : 14/010317
DATED : January 23, 2018
INVENTOR(S) : Biswajit Kanungo, Pramod Bandalore and Ravi Palaparthi Page 1 of 1

It is certified that error appears in the above-identified patent and that said Letters Patent is hereby corrected as shown below:

(72) Inventors should read:
Biswajit Kanungo
Pramod Bandalore
Ravi Palaparthi

Signed and Sealed this
Twenty-ninth Day of May, 2018

Andrei Iancu
*Director of the United States Patent and Trademark Office*